United States Patent [19]
Sakemura et al.

[11] Patent Number: 5,507,403
[45] Date of Patent: Apr. 16, 1996

[54] PROCESS FOR PRODUCING AN ELECTRONIC PART AND THE ELECTRONIC PART PRODUCED BY THE PROCESS

[75] Inventors: Yukio Sakemura; Mitsuru Usui; Tetsuya Watanabe, all of Hadano, Japan

[73] Assignee: Hitachi, Ltd., Japan

[21] Appl. No.: 375,708

[22] Filed: Jan. 20, 1995

[30] Foreign Application Priority Data

Jan. 21, 1994 [JP] Japan ................... 6-004998

[51] Int. Cl.⁶ ..................... H01B 13/00; B44C 1/22; C23F 1/00
[52] U.S. Cl. .................. 216/18; 216/39; 216/41; 257/759
[58] Field of Search ................ 361/414; 257/759; 216/18, 41, 39, 100

[56] References Cited

U.S. PATENT DOCUMENTS 4,713,494  12/1987  Oikawa et al. ............... 361/414 X

FOREIGN PATENT DOCUMENTS 62-36868  2/1987  Japan .
1-143292  6/1989  Japan ........................... 216/18

*Primary Examiner*—William Powell
*Attorney, Agent, or Firm*—Evenson, McKeown, Edwards & Lenahan

[57] ABSTRACT

An electronic part is produced by forming two metallic wiring films of different materials on a main substrate, where a first metallic wiring film is formed on the main substrate, a protective film is formed in desired regions on the main substrate and the first metallic wiring film, and a second metallic wiring film is formed on the first metallic wiring film. The thus produced electronic part has an insulating protective film between the first and second metallic wiring films. By the presence of the protective film the surface of the first metallic wiring film is protected from etching, corrosion or deterioration by an agent for patterning the second metallic wiring film.

11 Claims, 6 Drawing Sheets

PROCESS FOR PRODUCING AN ELECTRONIC PART AND THE ELECTRONIC PART PRODUCED BY THE PROCESS

BACKGROUND OF THE INVENTION

The present invention relates to a process for producing an electronic part such as LSI (large-scale integrated circuit), multilayered wiring substrates, etc., and the electronic part produced by the process.

Cross-sectional view of a conventional multilayered wiring substrate for high density application, provided on a main substrate with a thin film multilayered wiring comprising an organic insulating film and a metallic wiring pattern is shown in FIG. 11, where the multilayered wiring substrate has pads 3 for wiring extension on the front side of a ceramic substrate 2 and pads 4 for external connection on the back side thereof, each formed at the corresponding positions by printing patterns of, for example, tungsten paste, and these pads 3 and 4 at the corresponding positions are electrically connected to one another by sintered metallizing of printing patterns of the same tungsten paste, formed through the ceramic substrate 2 from the front side to the back side.

These printing patterns of tungsten have a poor bondability to a metallic wiring pattern of aluminum or the like provided on the substrate 2 or to a solder for use in external connection, for example, connection to a mother board. In order to improve the bondability to the metallic wiring pattern or solder, nickel plating layers 5 and 6 are formed on the pads 3 for wiring extension and the pads 4 for external connection, respectively.

When the nickel plating layer 5 is directly connected to the aluminum wiring pattern 10 as an upper layer, nickel and aluminum undergo a thermal reaction on the contact surface between the nickel plating layer 5 and the aluminum wiring pattern 10 during the heat treatment for forming an organic insulating film 9, and as a result a fusion layer of nickel and aluminum is formed at the contact surface. The fusion layer is so low in the electroconductivity that the electroconductivity between the nickel plating layer 5 and the aluminum wiring pattern 10 is lowered. In order to prevent formation of the fusion layer, a chromium film layer 8 is formed on the nickel plating layer 5 as an upper barrier metal layer. That is, the aluminum wiring pattern 10 is connected to the nickel plating layer 5 through the chromium film layer 8 in respective contact holes provided in the organic insulating film 9.

In a multilayered wiring substrate provided with two metallic wiring films of different materials on pads for wiring extension, these metallic wiring films have been usually formed in the following manner.

At first, a metallic wiring film is formed on the pads for wiring extension as a lower layer and patterned. Then, another metallic wiring film is formed as an upper layer directly on the lower layer, and patterned by an etching agent capable of selectively etching only the upper layer metallic wiring film among the lower and upper layer metallic wiring films.

When a photolithographic technique is used for patterning the upper layer metallic wiring film, the photoresist used for the patterning is released from the upper layer metallic wiring film by a resist-releasing agent after the patterning.

This kind of the foregoing technique is disclosed, for example, in JP-A-62-36868.

In the foregoing technique the lower layer metallic wiring film has been sometimes etched by the etching agent for patterning the upper layer metallic wiring film or corroded or deteriorated by the resist-releasing agent for removing the patterning photoresist. Consequently, when an organic insulating layer is further formed on the metallic wiring films in the multilayer structure, there have been such inconveniences as a decrease in the interlayer bondability between the exposed lower layer metallic wiring film and the organic insulating film, formation of clearances at the interface between the lower layer metallic wiring film and the organic insulating film, etc.

To prevent these inconveniences, it has been required to select an etching agent capable of selectively etching only the upper layer metallic wiring film and incapable of etching the lower layer metallic wiring film among the upper layer and lower layer metallic wiring films and select a resist-releasing agent incapable of corroding or deteriorating the upper and lower layer metallic wiring films. That is, there have been restrictions to the selection of etching agents or resist-releasing agents or ways to use them.

SUMMARY OF THE INVENTION

An object of the present invention is to provide a process for producing an electronic part with an improved degree of freedom in the selection of agents for use in patterning an upper layer metallic wiring film when two metallic wiring films of different materials are to be formed on a substrate.

Another object of the present invention is to provide an electronic part comprising two metallic wiring films of different materials and having a distinguished bondability between the metallic wiring films and an organic insulating film provided thereon.

The first object of the present invention can be attained by the present process for producing an electronic part which comprises forming two metallic wiring films of different materials successively on a main substrate, where a first metallic wiring film is formed on the main substrate, a protective film is formed in desired regions on the main substrate and the first metallic wiring film, and a second metallic wiring film is formed on the first metallic wiring film.

The second object of the present invention can be attained by the present electronic part which comprises a main substrate, a first metallic wiring film formed on the main substrate, a first organic insulating film formed on the main substrate and provided with contact holes above the first metallic wiring film, a second metallic wiring film formed on the first metallic wiring film, a second organic insulating film formed on the first organic insulating film and the second metallic wiring film and provided with contact holes above the second metallic wiring film, and a metallic wiring pattern formed on the second organic insulating film and the second metallic wiring film.

Since a protective film is formed between the first and second metallic wiring films in the present invention, the first metallic wiring film can be protected from an agent for patterning the second metallic wiring film by the protective film. Thus, the degree of freedom of selecting an etching agent or a resist-releasing agent for use in the patterning of the second metallic wiring film can be improved and also restrictions to ways to use the agents can be lessened.

Since the present electronic part has an insulating protective film between the first and second metallic wiring films of different materials, the surface of the first metallic wiring film can be prevented from etching, corrosion or deterioration, and thus a bondability to the upper layer organic insulating film can be improved.

Various materials can be used for the protective film. Above all, organic insulating materials are preferred because of higher heat resistance when the substrate is heated during the formation of the second metallic wiring film and also because of higher chemical resistance to the etching agent and resist-releasing agent. The organic insulating materials can be retained, as they are, even after the patterning of the second metallic wiring film, because they are insulating materials, but can be partially or entirely removed, if desired.

DESCRIPTION OF THE PREFERRED EMBODIMENTS

Figure 1:
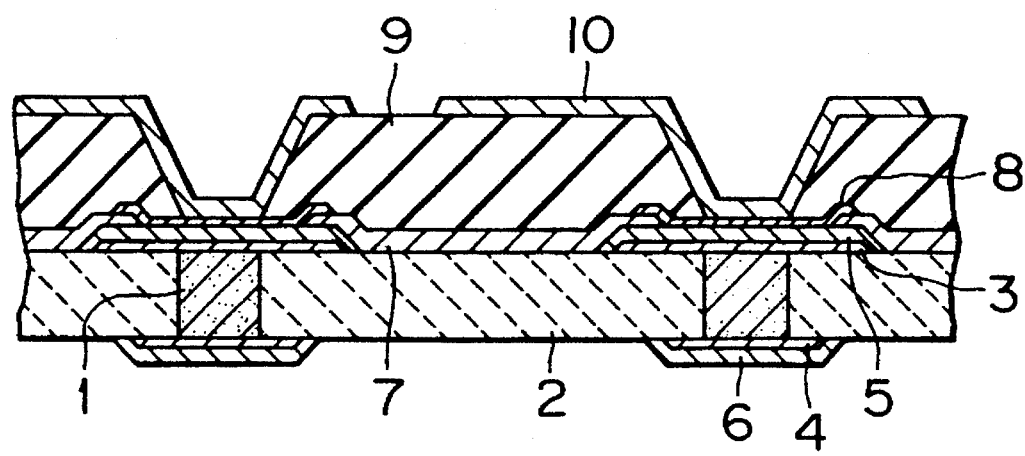
FIG. 1 is a cross-sectional view of a multilayered wiring substrate according to one embodiment of the present invention.

FIG. 1 shows a cross-sectional view of a multilayered wiring substrate for high density application according to one embodiment of the present invention.

In the multilayered wiring substrate, pads 3 for wiring extension and pads 4 for external connection are formed at corresponding positions by printing patterns of tungsten paste on the front side and the back side, respectively, of a ceramic substrate 2 through which sintered metallizings 1 of, for example, the same materials as that of the pads are formed.

These printing patterns of tungsten have a poor bondability to a metallic wiring pattern of aluminum or the like to be provided on the substrate 2 or to a solder. To improve the poor bondability, nickel plating layers 5 and 6 are formed on the pads 3 and 4, respectively. Furthermore, a protective film 7 of organic insulating material is provided on the nickel plating layers 5.

When the nickel plating layers 5 provided on the pads 3 for wiring extension on the ceramic substrate 2 are directly connected to aluminum as a material for the metallic wiring pattern of the thin film multilayered wiring to be formed on the ceramic substrate 2, nickel and aluminum undergo a thermal reaction on the contact surface of the aluminum wiring pattern and the nickel plating layers during the heat treatment of the organic insulating film 9, thereby forming a fusion layer on the interface between the aluminum wiring pattern and the nickel plating layers. Thus, to prevent formation of the fusion layer therebetween, a chromium film layer 8 is formed on the nickel plating layers 5 as an upper barrier metal layer. An organic insulating film 9 and an aluminum wiring pattern 10 are formed on these metallic wiring films as upper layers, and the aluminum wiring pattern 10 is connected to the chromium film layers 8 in contact holes provided in the organic insulating film 9.

A process for producing the above-mentioned multilayered wiring substrate and also for forming two upper and lower metallic wiring films, i.e. nickel plating layers 5 and chromium film layers 8 and a protective film 7 therebetween will be explained in detail below.

Figure 2:
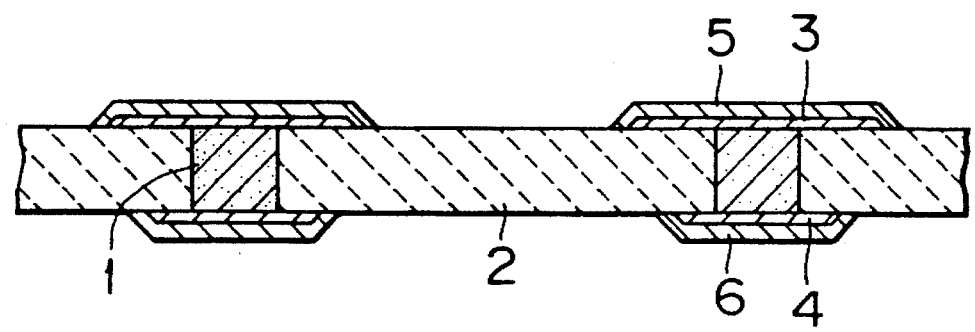
FIG. 2 shows the first step of a process for producing the multilayered wiring substrate shown in FIG. 1.

First step:

As shown in FIG. 2, pads 3 for wiring extension and pads 4 for external connection are formed at the corresponding positions on the front side and the back side, respectively, of a ceramic substrate 2, through which sintered metallizings 1 of the same material as that for pads 3 and 4 are formed. Formation of the pads 3 and 4 is carried out by placing a metallic screen plate, such as a stainless steel screen plate, with desired pattern openings on each side of the ceramic substrate 2 and applying a tungsten paste to the screen plate.

Then, the ceramic substrate 2 with these pads 3 and 4 is dipped into a nickel plating solution to form nickel plating layers 5 and 6 on the pads 3 and 4, respectively. In this embodiment, the nickel plating layers 5 and 6 have a thickness of about 4 μm.

Figure 3:
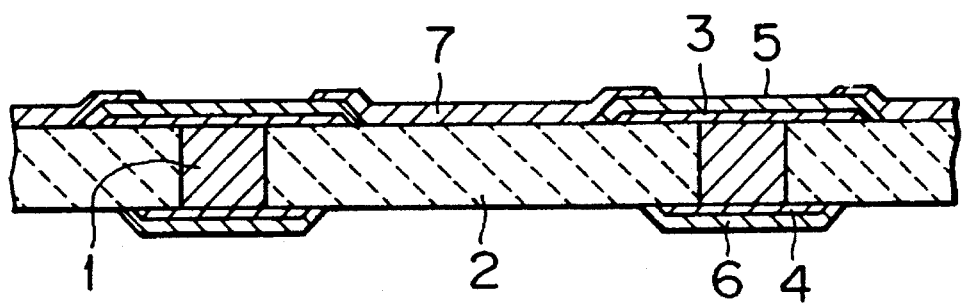
FIG. 3 shows the second step of a process for producing the multilayered wiring substrate shown in FIG. 1.

Second step:

As shown in FIG. 3, a protective film 7 is formed on the front side of the ceramic substrate 2. In this embodiment, a photosensitive polyimide, photo-P1Q (trademark of a product made by Hitachi Kasei Kogyo K.K., Japan), is used to make the protective film 7.

At first, the substrate 2 is placed on a spin table, and a predetermined amount of Photo-P1Q is dropwise applied to the substrate. The substrate is spin-coated at a constant rate of revolution for a given time to form a film. That is, the film of Photo-P1Q is formed to a desired thickness on the substrate by the so called spin coating.

Then, the substrate is subjected to a heat treatment at 85° C. in a nitrogen atmosphere. Then, a photo mask incapable of transmitting an ultraviolet ray only through desired regions is provided on the substrate and the substrate is irradiated with the ultraviolet ray through the photo mask. That is, the Photo-P1Q in other regions than those on the nickel plating layers 5 are irradiated by the ultraviolet ray by the so called photolithography to photosensitize the Photo-P1Q in the former regions. Then, the substrate is dipped into a developing solution to conduct a development treatment, whereby the Photo-P1Q in the ultraviolet ray-unirradiated regions on the nickel plating layers 5 is dissolved into the developing solution to form contact holes in these regions. Furthermore, the substrate 2 is subjected to a heat treatment at 400° C. to form the protective film. In this embodiment the protective film 7 has a thickness of about 2 μm.

Figure 4:
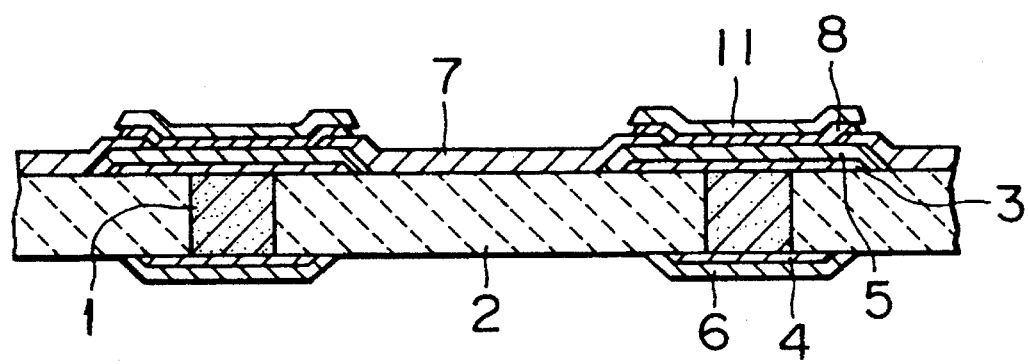
FIG. 4 shows the third step of a process for producing the multilayered wiring substrate shown in FIG. 1.

Third step:

As shown in FIG. 4, a chromium film layer 8 is formed on the nickel plating layers 5.

At first, chromium atoms are sputtered from a target by allowing plasma ions to hit the target to deposit the chromium atoms onto the substrate. That is, a chromium film layer is formed to a desired thickness, i.e. 0.15 μm in this embodiment, on the entire surface of the substrate by the so called sputtering.

Then, a negative type, resist film is formed as an etching mask on the chromium film layer by spin coating and only desired regions of the negative type, resist film is irradiated with an ultraviolet ray through a photo mask to photosensitize the desired regions. Then, the substrate 2 is dipped into a developing solution to dissolve the negative type, resist film in the non-photosensitized regions, thereby patterning the negative type, resist film 11.

Then, the substrate 2 is dipped into an etching solution to etch the chromium film, thereby forming a chromium film layer 8 as a barrier metal on the nickel plating layers 5. In this embodiment, an aqueous solution of ceric ammonium nitrate in a ratio of ceric ammonium nitrate: water=2,500:14 l is used as an etching solution. After the formation of the chromium film layer 8, the substrate 2 is dipped into a resist-releasing solution to remove the negative type, resist film 11.

In the foregoing etching treatment and the resist-releasing treatment, the nickel plating layers 5 are not brought into direct contact with the etching solution or the resist-releasing solution and thus does not undergo etching, corrosion or deterioration, because the protective film 7 is formed on the exposed regions of the nickel plating layers 5 from the chromium film layer 8.

Figure 5:
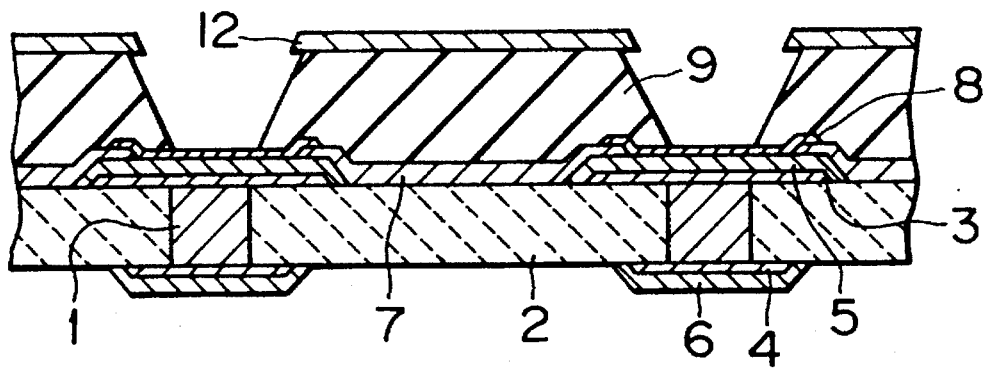
FIG. 5 shows the fourth step of process for producing the multilayered wiring substrate shown in FIG. 1.

Fourth step:

As shown in FIG. 5, an organic insulating film 9 is formed. In this embodiment, polyimide resin P1Q (trademark of a product made by Hitachi Kagaku Kogyo K.K., Japan) is used for the organic insulating film 9.

At first, P1Q is applied to the ceramic substrate 2 by spin coating, and then the substrate 2 is subjected to a heat treatment at 400° C. to form a P1Q film on the entire surface of the substrate. In this embodiment, the P1Q film is formed to a thickness of about 12 μm.

Then, a negative type resist film is formed as an etching mask on the P1Q film and only desired regions of the negative type resist film are irradiated with an ultraviolet ray through a photo mask to photosensitize the desired regions. Then, the substrate 2 is dipped into a developing solution to dissolve the non-photosensitized regions of the negative type resist film, thereby patterning the negative type, resist film 12.

Then, the substrate 2 is dipped into an etching solution to etch the P1Q film, thereby forming contact holes above the chromium film layers 8. In this embodiment, a hydrazine solution heated to about 30° C. is used to etch the P1Q film.

After the formation of contact holes, the substrate 2 is dipped into a resist-releasing solution to remove the negative type, resist film 12, thereby forming an organic insulating film 9.

Figure 6:
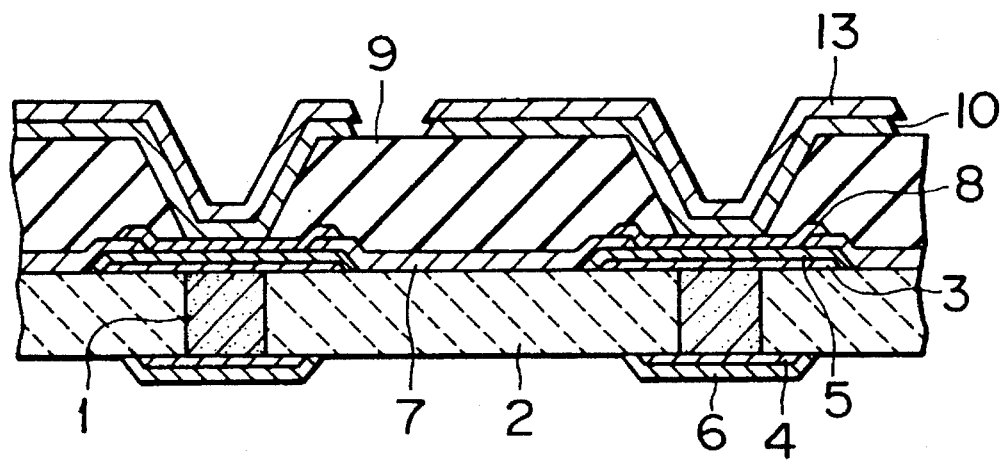
FIG. 6 shows the fifth step of a process for producing the multilayered wiring substrate shown in FIG. 1.

Fifth step:

As shown in FIG. 6, an aluminum wiring pattern 10 is formed.

At first, an aluminum film is formed on the entire surface of the substrate by sputtering. In this embodiment, the aluminum film is formed to a thickness of about 4 μm.

Then, a positive type resist film is formed as an etching mask on the aluminum film by spin coating and other regions than the desired ones of the positive type resist film are irradiated with an ultraviolet ray through a photo mask to photosensitize the former regions. Then, the substrate 2 is dipped into a developing solution to dissolve the photosensitized regions of the positive type, resist film, thereby patterning the positive type, resist film 13.

Then, the substrate 2 is dipped into an etching solution to etch the aluminum film, thereby forming an aluminum wiring pattern 10. In this embodiment, an aqueous etching solution of phosphoric acid, acetic acid and nitric acid in a ratio of phosphoric acid:acetic acid:nitric acid:water= 15:3:1:1 by weight is used to etch the aluminum film.

After the formation of aluminum wiring pattern 10, the substrate 10 is dipped into a resist-releasing solution to remove the positive type, resist film 13.

By further repetition of the fourth step and the fifth step, a multilayered wiring substrate can be produced in this embodiment. In this embodiment, an organic insulating material is used for the protective film 7, and thus the protective film 7 works also as an insulating film.

Figure 7:
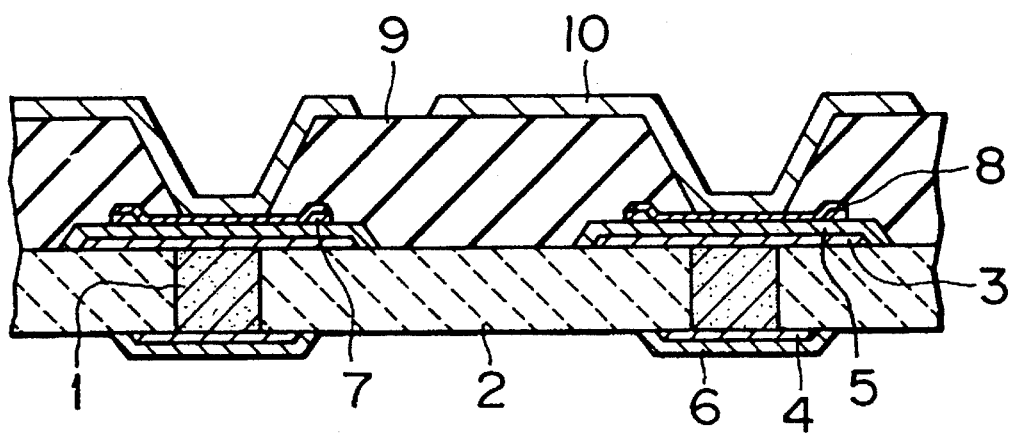
FIG. 7 is a cross-sectional view showing a multilayered wiring substrate according to another embodiment of the present invention.

Another embodiment of the present invention will be described in detail below:

Cross-sectional view of a multilayered wiring substrate according to this second embodiment of the present invention is shown in FIG. 7. In this multilayered wiring substrate, parts of the protective film 7 of the first embodiment shown in FIG. 1 are removed so that the organic insulating film 9 is brought into direct contact with the nickel plating layers 5.

A process for producing the multilayered wiring substrate according to the second embodiment of the present invention will be described in detail below:

The first to third steps are carried out in the same manner as in the foregoing first embodiment to form a chromium film layer 8 on the nickel plating layers 5.

Figure 8:
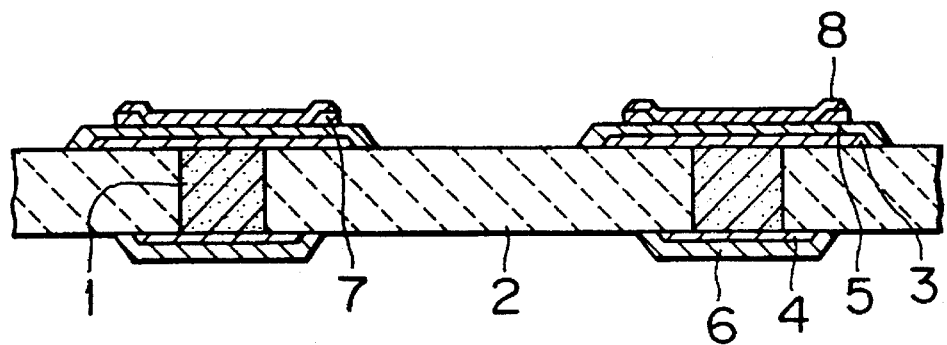
FIG. 8 shows the third step of a process for producing the multilayered wiring substrate shown in FIG. 7.

Then, as shown in FIG. 8, parts of the protective film are removed in this embodiment. That is, etching is carried out by allowing plasma ions to hit the substrate 2 in such a state that the negative type, resist film 11 remains on the chromium film layer 8. That is, parts of the negative type, resist film 11 and protective film 7 are removed together by the so called dry etching, where the protective film 7 under the chromium film layer 8 remains without etching, because the chromium film layer 8 works as an etching mask.

In the dry etching, hitting rate of plasma ions is controlled by an applied voltage, and thus the etching can be carried out without giving any influence on the nickel plating film layers 5 and chromium film layer 8.

Figure 9:
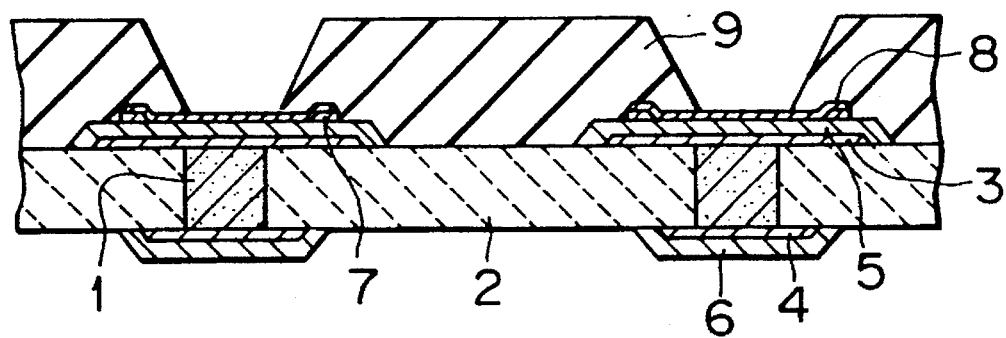
FIG. 9 shows the fourth step of a process for producing the multilayered wiring substrate shown in FIG. 7.

Then, the fourth step is carried out in the same manner as in the first embodiment to form an organic insulating film 9, as shown in FIG. 9. In this case, the exposed regions of the nickel plating layers 5 from the chromium film layer 8 are brought into direct contact with the organic insulating film 9, but the nickel plating layers 5 are never etched owing to the presence of the protective film 7 even during the etching treatment of the chromium film layer 8, and also the nickel plating layers 5 are not influenced even during the etching treatment of the protective film 7. Thus, a good bonding can be maintained without any decrease in the interlayer bondability between the nickel plating layers 5 and the organic insulating film 9.

Figure 10:
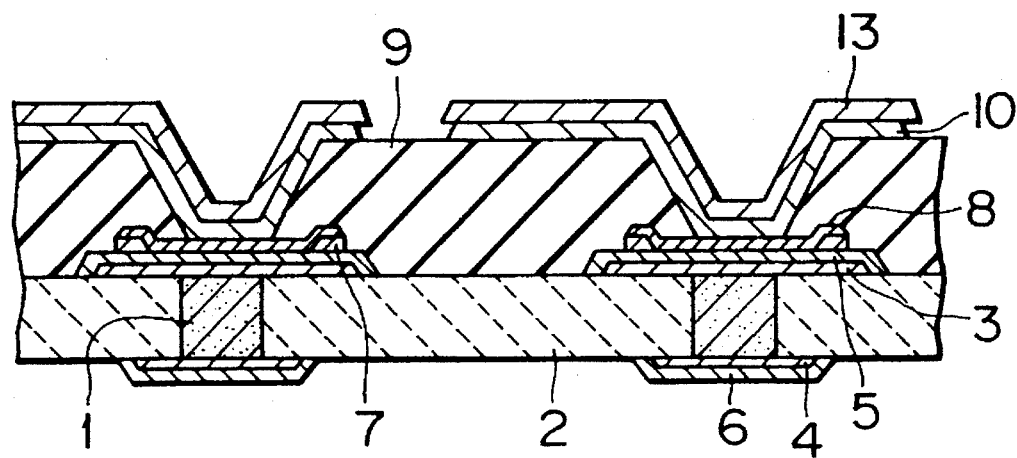
FIG. 10 shows the fifth step of a process for producing the multilayered wiring substrate shown in FIG. 7.
Figure 11:
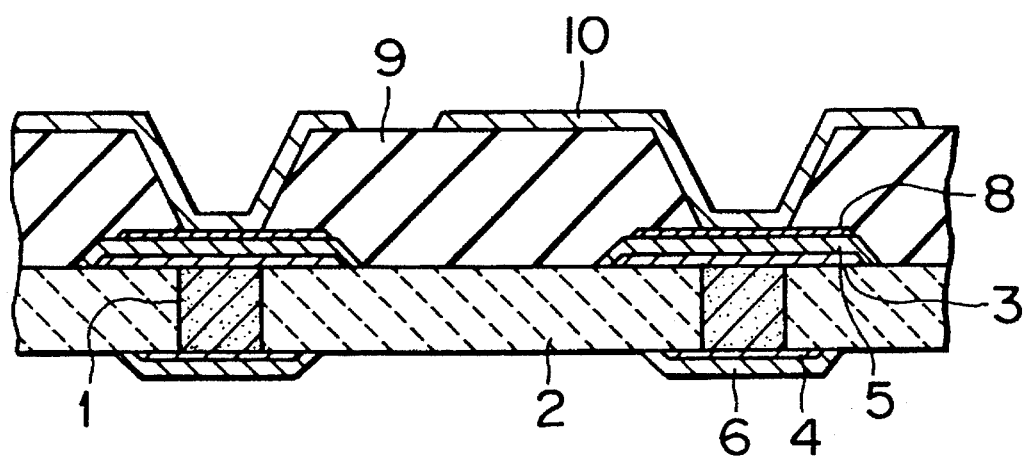
FIG. 11 is a cross-sectional view of a conventional multilayered wiring substrate for high density application.

Then, the fifth step is carried out in the same manner as in the first embodiment to form an aluminum wiring pattern 10, as shown in FIG. 10.

A multilayered wiring substrate can be produced through the foregoing steps in this embodiment.

The present invention has been described in detail above, referring to embodiments, but is not limited to these embodiments and can be modified to various degrees within the spirit and scope of the present invention. For example, description has been made of the case that electronic parts are multilayered wiring substrates for high density application in the foregoing embodiments, but the present invention can be applied to a broad range of electronic parts including, for example, LSI, etc.

In the foregoing embodiments, description has been made of the case that an organic insulating material is used for the protective film 7, but the same insulating material as that of, for example, organic insulating film 9 can be used. Furthermore, the resist film used for patterning of the metallic wiring film can be used as protective film 7.

According to the present process for producing an electronic part, a protective film is formed between two metallic wiring films of different materials provided on the main substrate, and thus the lower layer metallic wiring film can be protected from the etching agent or the resist-releasing agent used for patterning of the upper layer metallic wiring film. Thus, it is not necessary to particularly select an etching agent or a resist-releasing agent having no influence on the lower layer metallic wiring film. That is, a degree of freedom to select the etching agent or resist-releasing agent can be increased with reduction in the restriction to their use. In other words, there are no necessities for development and production of special chemicals and the upper layer metallic wiring film can be patterned by ordinary relatively cheap chemicals.

In the present electronic parts, an insulating protective film is provided between the upper layer and lower layer metallic wiring films, and thus the surface of the lower layer metallic wiring film can be protected from etching, corrosion or deterioration during the patterning of the upper metallic wiring film, resulting in increased bondability to the organic insulating film.

What is claimed is:

1. A process for producing an electronic part, which comprises:

a step of providing a main substrate through which sintered metallizings are provided from the front side to the back side, a step of forming pads for wiring extension at positions of the sintered metallizings on the front side of the main substrate, a step of forming a first metallic wiring film on the pads for wiring extension, a step of forming a protective film in desired regions on the main substrate and the first metallic wiring film, a step of forming a second metallic wiring film on the first metallic wiring film, a step of forming an organic insulating film in desired regions on the protective film and the second metallic wiring film, and a step of forming a metallic wiring pattern on the organic insulating film and the second metallic wiring film.

2. A process according to claim 1, wherein the step of forming the protective film comprises a step of forming the protective film on the main substrate and the first metallic wiring film and a step of forming first contact holes in the protective film on the first metallic wiring film.

3. A process according to claim 1, wherein the step of forming the second metallic wiring film comprises a step of forming the second metallic wiring film on the protective film and the first metallic wiring film, a step of forming a resist film in desired regions on the second metallic wiring film, a step of etching the second metallic wiring film, thereby forming the second metallic wiring film on the first metallic wiring film, and a step of releasing the resist film from the second metallic wiring film.

4. A process according to claim 1, wherein the step of forming the organic insulating film comprises a step of forming the organic insulating film on the protective film and the second metallic wiring film, and a step of forming second contact holes in the organic insulating film on the second metallic wiring film.

5. A process for producing an electronic part, which comprises:

a step of providing a main substrate through which sintered metallizings are provided from the front side to the back side, a step of forming pads for wiring extension at positions of the sintered metallizings on the front side of the main substrate, a step of forming a first metallic wiring film on the pads for wiring extension, a step of forming a protective film in desired regions on the main substrate and the first metallic wiring film, a step of forming a second metallic wiring film on the first metallic wiring film, a step of releasing the protective film, a step of forming an organic insulating film on the protective film and the second metallic wiring film, a step of forming second contact holes in the organic insulating film on the second metallic wiring film, and a step of forming a metallic wiring pattern on the organic insulating film and the second metallic wiring film.

6. A process according to claim 5, wherein the step of forming the protective film comprises a step of forming the protective film on the main substrate and the first metallic wiring film, and a step of forming first contact holes in the protective film on the first metallic wiring film.

7. A process according to claim 5, wherein the step of forming the second metallic wiring film comprises a step of forming the second metallic wiring film on the protective film and the first metallic wiring film, a step of forming a resist film in desired regions on the second metallic wiring film, a step of etching the second metallic wiring film, thereby forming the second metallic wiring film on the first metallic wiring film, and a step of releasing the resist film from the second metallic wiring film.

8. A process according to claim 5, wherein the step of forming the organic insulating film comprises a step of forming the organic insulating film on the protective film and the second metallic wiring film and a step of forming second contact holes in the organic insulating film on the second metallic wiring film.

9. A process according to claim 1, wherein the step of releasing the resist film from the second metallic wiring film is to release the resist film and the protective film at the same time.

10. An electronic part, which comprises:

a main substrate through which sintered metallizings are provided from the front side to the back side, pads for wiring extension, formed on the main substrate and connected each to the sintered metallizings in the main substrate, a first metallic wiring film formed on the pads for wiring extension, a first organic insulating film formed on the main substrate, first contact holes formed in the first organic insulating film and on the first metallic wiring film, a second metallic wiring film of different material from that of the first metallic wiring film, formed on the first metallic wiring film, a second organic insulating film formed on the first organic insulating film and the second metallic wiring film, second contact holes formed in the second organic insulating film and on the second metallic wiring film, and a metallic wiring pattern formed on the second organic insulating film and the second metallic wiring film.

11. An electronic part according to claim 10, wherein material of the second organic insulating film is different from that of the first organic insulating film.

* * * * *